United States Patent [19]

Hamada

[11] 4,015,213

[45] Mar. 29, 1977

[54] PULSE WIDTH MODULATED SIGNAL AMPLIFIER

[75] Inventor: Osamu Hamada, Tokyo, Japan

[73] Assignee: Sony Corporation, Tokyo, Japan

[22] Filed: Feb. 23, 1976

[21] Appl. No.: 660,351

[30] Foreign Application Priority Data

Feb. 24, 1975 Japan .............................. 50-22589

[52] U.S. Cl. ................................. 330/10; 307/228; 332/9 R; 332/14
[51] Int. Cl.² ....................... H03F 3/38; H03K 7/08
[58] Field of Search .............. 330/10; 332/9 R, 9 T, 332/14; 324/118

[56] References Cited

UNITED STATES PATENTS 3,413,570  11/1968  Bruene et al. .................... 332/14 X
3,585,517  6/1971  Herbert .................................. 330/10

Primary Examiner—Siegfried H. Grimm
Attorney, Agent, or Firm—Lewis H. Eslinger; Alvin Sinderbrand

[57] ABSTRACT

A pulse width modulated (PWM) signal amplifier includes an input terminal supplied with an input signal to be modulated, a sawtooth wave generator, and a first amplitude comparator supplied with the input signal and with the output signal of the sawtooth wave generator to produce a first control signal each time the amplitudes of the both signals become equal. A bistable circuit having first, second and third terminals is provided, in which the first terminal is supplied with the first control signal. A subtracting circuit is connected to receive the input signal supplied to the input terminal and the output signal from the second terminal of said bistable circuit and to combine these signals subtractively. An integrating circuit integrates the output signal of the subtracting circuit. A second amplitude comparator is supplied with the output signal of the integrating circuit and with a reference signal to produce a second control signal each time the amplitudes of signals applied to the second comparator become equal, the second control signal being applied to the third terminal of the bistable circuit to produce a PWM signal to be applied to a pulse amplifier.

11 Claims, 8 Drawing Figures

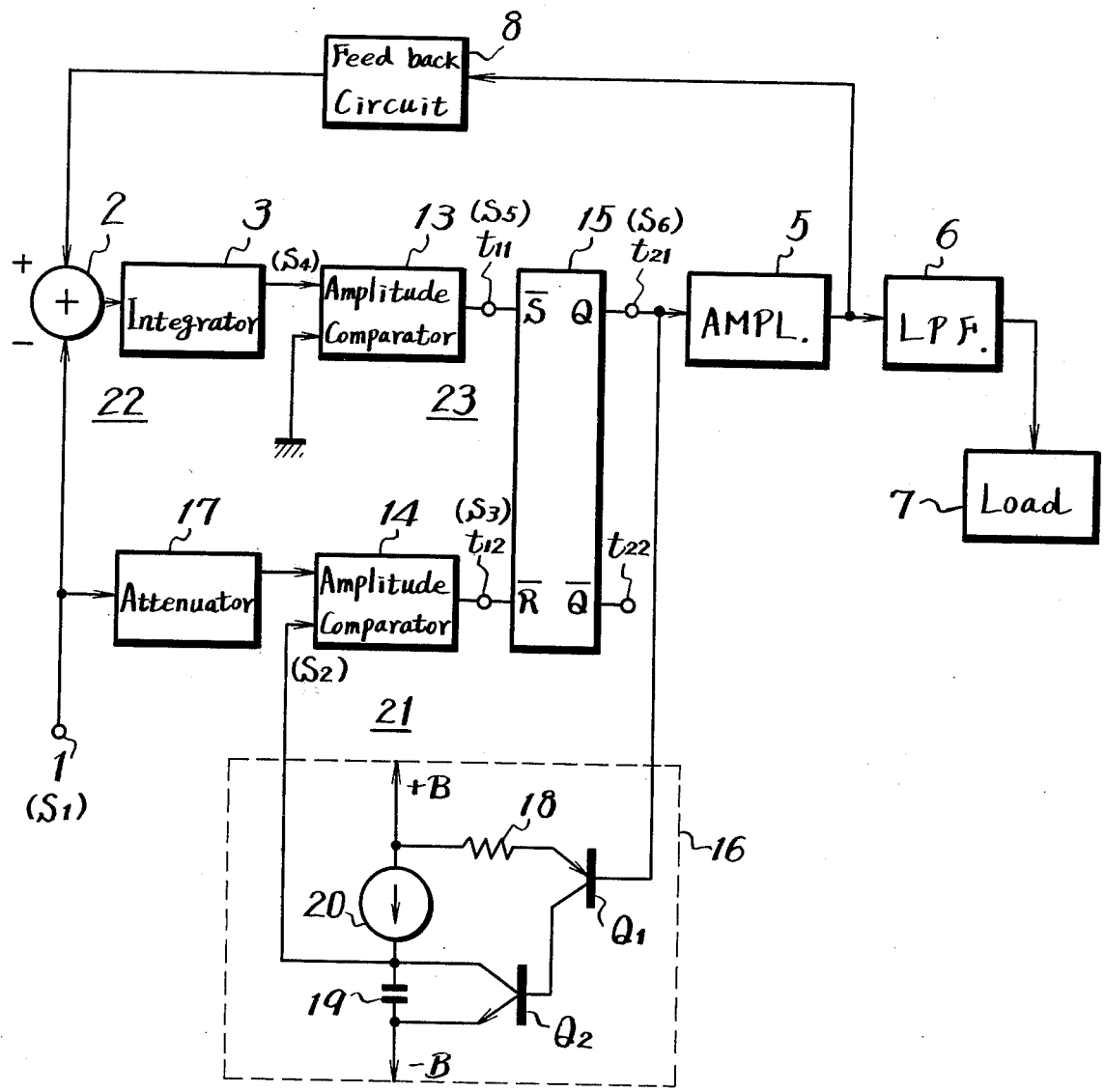

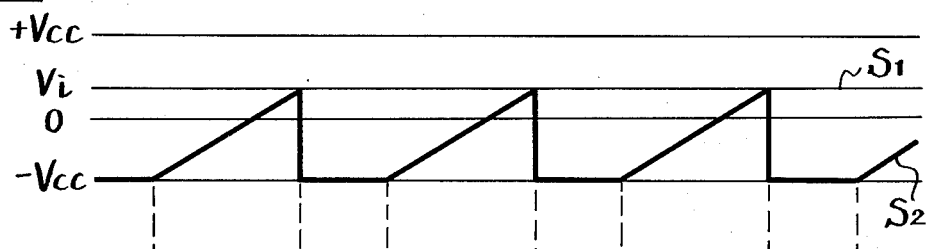
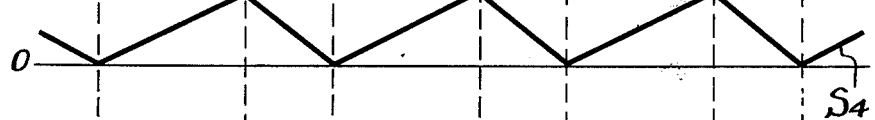
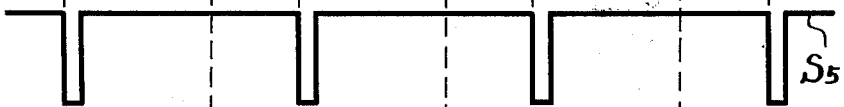
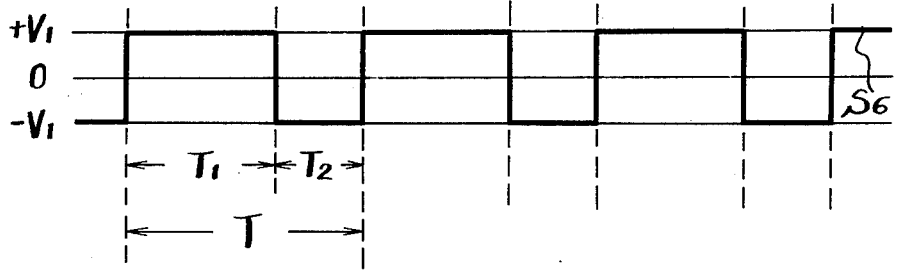

PULSE WIDTH MODULATED SIGNAL AMPLIFIER

BACKGROUND OF THE INVENTION

1. Field of the Invention

The present invention relates generally to a pulse width modulated (PWM) signal amplifier and, in particular, is directed to a pulse width modulator in which the integrated value of a PWM signal within one period is in proportion to the integrated value of an input signal to be modulated within the period corresponding to the above one period of the PWM signal.

2. Description of the Prior Art

The present invention is an improvement over a self-oscillating type of PWM amplifier in which an input signal is added to another signal and the sum signal is integrated and applied to a hysteresis circuit to produce a PWM signal. This signal is amplified in a D-class amplifier and is connected through a negative feedback circuit to the adder to constitute the second signal. The output of the D-class amplifier is also applied through a low pass filter to a load.

When the frequency of such a self-oscillation type of PWM signal is caused to fluctuate, its side band is mixed with the audible frequency band, and the output signal from the filter, as well as the demodulated signal may contain distortion not present in the input signal.

The present invention also represents an improvement over an external synchronization type of PWM signal amplifier. The external synchronization type includes a sample-and-hold circuit connected to receive the sum signal as well as a sawtooth signal of predetermined frequency. The output of the sample-and-hold circuit is in the form of the PWM signal and is applied to a D-class amplifier and from there to a low pass filter to be demodulated as the original signal. This demodulated signal is fed back to the adder circuit as the signal to be added to the input signal to form the sum signal. The demodulated signal is also applied to a load circuit.

If the frequency of the sawtooth signal applied to the sample-and-hold circuit is not changed, distortion in the demodulated signal due to fluctuation of the oscillation frequency is avoided. However, the duty cycle of the PWM output signal of the sample-and-hold circuit is changed in accordance with the level of the input signal so that there is no proportional relation between the integrated value of the PWM signal within one period thereof and the integrated value of the input signal within a period corresponding to one period of the PWM signal. As a result, distortion is produced in the demodulated signal from the low pass filter.

SUMMARY OF THE INVENTION

It is a main object of the present invention to provide an improved PWM signal amplifier free from the defects of the prior art.

It is another object of the invention to provide a PWM signal amplifier in which the integrated value of a PWM signal within one of its periods is in correct proportion to the integrated value of an input signal within a period corresponding to one period of the PWM signal.

In accordance with an aspect of the present invention, there is provided a PWM signal amplifier which comprises an input terminal supplied with an input signal to be modulated, a sawtooth wave signal generator, a first amplitude comparator supplied with the input signal and the output signal of the sawtooth wave generator so as to produce a train of first control signals when the amplitudes of both the signals become equal, a bistable circuit having first, second and third terminals, said first terminal being supplied with the first control signal, a circuit for integrating the input signal and the output signal from the second terminal of the bistable circuit and subtracting the integration result thereof, a second amplitude comparator supplied with the output signal of the integrating and subtracting circuit and a reference signal so as to produce a train of second control signals when the amplitudes of both the signals become equal, and a circuit for supplying the second control signals to the third terminal of the bistable circuit, to thereby produce a pulse width modulated signal at the second terminal of the bistable circuit.

BRIEF DESCRIPTION OF THE DRAWINGS

FIG. 3 is a circuit diagram, partially in block, showing an embodiment of the PWM signal amplifier according to the present invention; and FIGS. 4A and 4E, inclusive, are waveform graphs used for explaining the operation of PWM signal amplifier of the embodiment shown in FIG. 3.

DESCRIPTION OF THE PREFERRED EMBODIMENT

Figure 1:
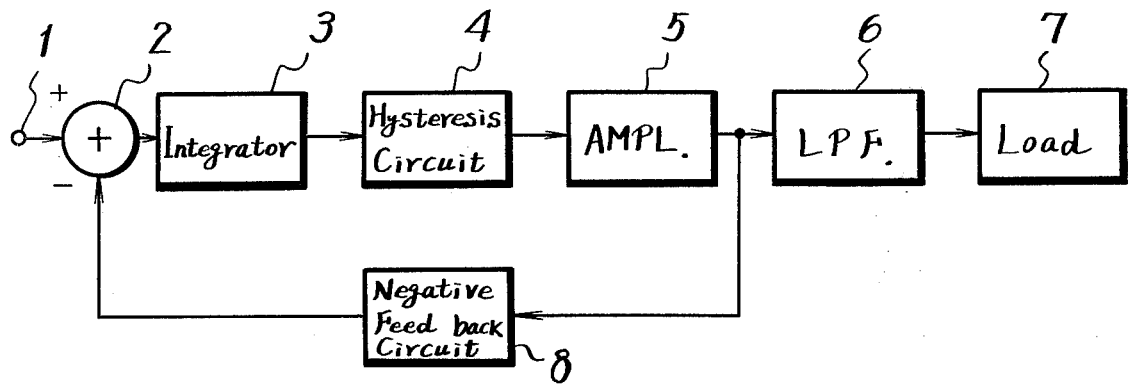
FIGS. 1 and 2 are block diagrams showing two forms of prior art PWM signal amplifiers.

FIG. 1 shows a self-oscillating type of PWM signal amplifier over which the present invention is an improvement. The PWM signal amplifier includes an input terminal 1 to which an input signal, such as an audio signal or the like, is applied, and an adder circuit 2 which receives one input signal via the input terminal 1. The output signal from the adder 2 is applied to an integrator circuit 3, and the output signal from the latter is applied to a hysteresis circuit 4. A PWM signal is obtained from the hysteresis circuit 4 and is then fed to a D-class amplifier 5 to be amplified thereby. The output signal from the D-class amplifier 5 is connected to a low pass filter 6 to be integrated thereby, and is then applied to a load 7. The output signal from the D-class amplifier 5 is also connected through negative feedback circuit 8 to the second input terminal of the adder 2.

With the PWM signal amplifier shown in FIG. 1, the input signal at the terminal 1 and the PWM signal from the amplifier 5 are added together and supplied to the integrator 3. The combined signal is integrated and supplied to the hysteresis circuit 4. Integrating the PWM signal converts it to a sawtooth wave signal, the slope of which is controlled in accordance with the level of the input signal by the hysteresis circuit 4, so that a PWM signal having a time width in accordance with the level of the input signal is obtained.

Figure 2:
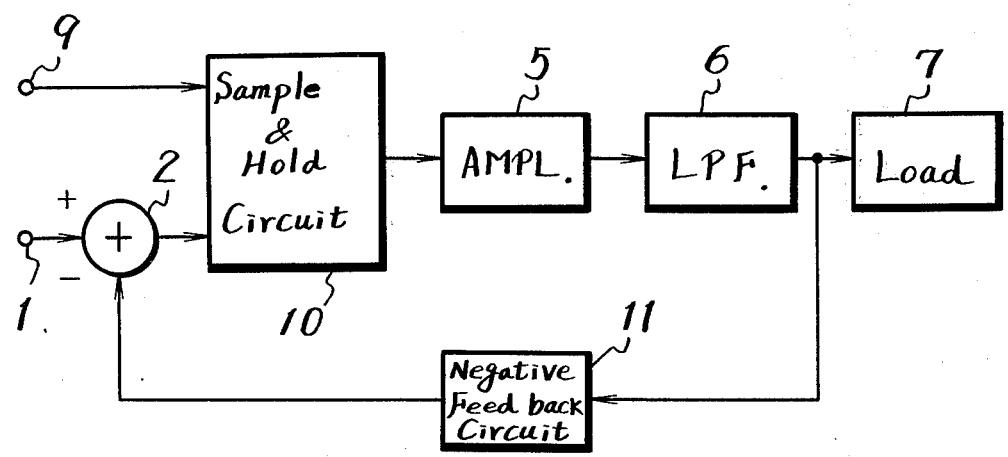

An external synchronization type of PWM signal amplifier shown in FIG. 2 has been also known heretofore. The components in FIG. 2 that correspond to those in FIG. 1 are identified with the same reference numerals and their description will be omitted. The circuit in FIG. 2 includes a sample-and-hold circuit 10 that has an input terminal 9 to which a sawtooth wave signal of a predetermined frequency is applied. The output signal of the adder circuit 2 is also applied with the input signal to the sample-and-hold circuit 10 and the latter produces a PWM signal that has a time width that depends upon the amplitude of the input signal fed to the input terminal 1. The PWM signal from the sample-and-hold circuit 10 is supplied to the D-class amplifier 5 and the amplified output signal from the amplifier 5 is supplied to the low pass filter 6 to be demodulated as the original input signal. This demodulated signal is supplied to the load 7. The demodulated or output signal from the low pass filter 6 is also supplied through the negative feedback circuit 11 to the adder circuit 2.

An embodiment of a PWM signal amplifier according to the present invention will be described with reference to FIG. 3 in which the same reference numerals represent the elements or parts that are the same as in the circuits in FIGS. 1 and 2.

FIG. 3 includes the input terminal 1 connected to the combining circuit 2 in which signals are subtractively combined and which, therefore, may be considered a subtracter circuit. The circuit in FIG. 3 also includes the integrator 3, the D-class amplifier 5, the low pass filter 6, the load circuit 7, and the feedback circuit 8 described in connection with previous figures.

FIG. 3 includes two amplitude comparators 13 and 14. The comparator 13 has one input connected to the output of the integrator 3, and the other input connected to a reference voltage source, such as ground. The output of the comparator 13 is connected to an input terminal $t_{11}$ of an R-S flip-flop 15. The terminal $t_{11}$ is the setting input terminal of the flip-flop. The Q output signal of the flip-flop 15 derived through a terminal $t_{21}$ is applied to the amplifier 5 and to a sawtooth wave generator 16. An attenuator 17 is connected between the input terminal 1 and one of the input terminals of the comparator 14. The output of the sawtooth wave signal generator circuit is connected to the other input terminal of the comparator 14.

The sawtooth circuit 16 includes a PNP transistor $Q_1$ that has its base electrode connected to the output terminal $t_{21}$ of the flip-flop circuit 15. A resistor 18 is connected between the emitter of the transistor $Q_1$ and the positive power supply voltage terminal indicated as +B. The collector of the transistor $Q_1$ is connected to the base of a second transistor $Q_2$ and a capacitor 19 across which the sawtooth voltage is generated is connected between the collector and emitter of the NPN transistor $Q_2$. The emitter of the transistor $Q_2$ is connected to the negative power supply terminal −B. A constant current circuit 20 is connected in series with the capacitor 19 between the positive and negative power supply terminal +B and −B, and the common connection between the capacitor and the constant current circuit is connected to the second input terminal of the comparator 14.

The individual circuits in FIG. 3 may be grouped together according to their functions. One group is identified as a control circuit 21 which consists of the sawtooth signal generator circuit 16, the comparator circuit 14, and the bistable or flip-flop circuit 15. The output terminal of the comparator circuit 14 is connected to an input terminal $t_{12}$, which is the resetting terminal of the flip-flop circuit 15. The combining circuit 2 and the integrator 3 may be considered to be a comparison circuit 22. Another control circuit 23 includes the comparator 13 and the flip-flop circuit 15.

At the output terminal $t_{21}$ of the flip-flop circuit 15, there is obtained a pulse signal having a time width that corresponds directly to the level of the input signal applied to the input terminal 1. This pulse signal is a PWM pulse signal, and it is amplified by the D-class amplifier 5. When the PWM signal is applied to the low pass filter 6, the signal is demodulated or detected by the low pass filter 6, and the demodulated signal is supplied to the load 7.

The operation of the PWM signal amplifier of the invention described above in connectin with FIG. 3 will now be described with reference to FIGS. 4A to 4E which show waveforms symbolic of signals at the respective points of the PWM signal amplifier shown in FIG. 3.

FIG. 4A shows the input signal $S_1$ which is supplied to the input terminal 1 and also shows a sawtooth wave signal $S_2$ (of, for example, 500 KHz) which is the output signal of the sawtooth wave signal generator 16, respectively. The signal $S_1$ appears to have a constant value because it varies so slowly in comparison with the sawtooth impulses in signal $S_2$. The voltages of voltage sources +B and −B are identified as $+V_{CC}$ and $-V_{CC}$, respectively, and the level of the input signal $S_1$ is identified as $V_i$. FIG. 4B shows a pulse signal $S_3$, which is the output signal from the comparator 14 and is applied to the input terminal $t_{12}$ of the flip-flop circuit 15 to reset the flip-flop. FIG. 4C shows the output signal $S_4$ from the integrator 3 and is applied to the amplitude comparator 13. FIG. 4D shows a pulse signal $S_5$ representative of the output signal from the comparator 13 applied to the input terminal $t_{11}$ of the flip-flop circuit 15. FIG. 4E shows a pulse signal $S_6$, which is the PWM signal and is the output signal from the flip-flop circuit 15 at the terminal $t_{21}$ connected to the amplifier 5. The PWM signal $S_6$ is a rectangular signal having a level that varies between +V and −V with the reference level 0, or ground potential, as the center, as shown in FIG. 4E. The period of the rectangular signal $S_6$ is defined as T, its time width is taken as $T_1$, and the time difference $T-T_1$ is taken as $T_2$.

The sawtooth wave signal $S_2$, which is the output signal of the sawtooth wave signal generator 16, starts at the level $-V_{CC}$ and begins to rise at the time point when the pulse $S_5$ or the output signal of the comparator 13 is applied to the setting input terminal $t_{11}$ of the flip-flop circuit 15. When the sawtooth wave signal $S_2$ reaches the level $V_i$, the comparator 14 produces an output, or control, signal pulse $S_3$ and applies the pulse $S_3$ to the reset input terminal $t_{12}$ of the flip-flop circuit 15. The transistor $Q_2$ suddenly becomes conductive so that the sawtooth wave signal $S_2$ drops sharply. Resetting of the flip-flop circuit 15 by the pulse signal $S_3$ occurs at the time when the signals $S_1$ and $S_2$ compared in the comparator 14 are equal. On the other hand, the flip-flop circuit 15 is set at the occurrence of each pulse signal $S_5$ at the time when the integrated value of the PWM signal $S_6$ within one period T is equal to the integrated value of the input signal $S_1$ within the same period. Integrating the input signal $S_1$, which has almost a constant value over the time T in FIG. 4E produces a constantly and linearly increasing signal. Integration of the PWM signal $S_6$ over the interval T produces an increasing portion during the time $T_1$ followed by a decreasing portion during the time $T_2$. In this case, if the reference voltage of the comparator 13 is changed suitably, it will be possible for the integrated value of the input signal $S_1$ within a predetermined period T to be proportional to the integrated value of the PWM signal $S_6$ within the corresponding period. As a result, at the output terminal $t_{21}$ of the flip-flop 15 there is obtained the pulse signal or PWM signal $S_6$ which has the time width $T_1$ in accordance with the level of the input signal $S_1$ and the period T such that the integrated value thereof within one period is in proportion to that of the input signal $S_1$ within the same period, whereby the signal $S_4$ applied to one input of the comparator 13 reaches zero, the value of the reference signal applied to the other input of the comparator 13, and causes this comparator to produce the signal $S_5$ at the end of the interval T. Instead of integrating the signals $S_1$ and $S_6$ separately in two circuits and then combining the integrated signals in opposite polarity (subtracting them), they are subtractively combined in the subtracter circuit 2 and the resultant signal is integrated in a single circuit 3.

The above fact will now be explained by utilizing equations.

Since the time width $T_1$ of the PWM signal $S_6$ is varied in accordance with the level $V_i$ of the input signal $S_1$, the time width $T_1$ is expressed by the following equation (1):

$$T_1 = T_0 + m V_i \qquad 1.$$

where $T_0$ is a constant and $m$ is a proportional constant, respectively.

Further, as may be apparent from the above description and FIG. 4E, the following equation (2) can be derived:

$$T = T_1 + T_2 \qquad 2.$$

If the fact that the integrated value of the pulse signal or PWM signal $S_6$ within one period is in proportion to that of the input signal $S_1$ within the same period, is expressed by an equation, the following equation (3) is obtained:

$$V_1 T_1 - V_1 T_2 = k V_i (T_1 + T_2) \qquad 3.$$

where $k$ is a proportional constant but can be varied in response to the setting of the reference voltage of the comparator 13. In this case, the left side of the equation (3) shows the integrated value of the PWM signal $S_6$ of FIG. 4E within one period $T$, while the right side thereof except the constant $k$ shows the integrated value of the input signal $S_1$ of FIG. 4A within the same period $T$.

If the factor $T_2$ is solved based upon the equation (3), it can be expressed as follows:

$$T_2 = \frac{V_1 - k V_i}{V_1 + k V_i} \cdot T_1 \qquad (4)$$

If the equation (4) is substituted in the equation (2), the factor $T$ can be expressed as follows:

$$T = \frac{2 V_1}{V_1 + k V_i} \cdot T_1 \qquad (5)$$

If the equation (1) is substituted in the equation (5), the factor $T$ can be expressed as follows:

$$T = \frac{2 V_1}{V_1 + k V_i} (T_0 + m V_i)$$

$$= \frac{2 T_0}{V_1 + k V_i} \left( V_1 + \frac{m V_1 V_i}{T_0} \right) \qquad (6)$$

If the relation among the factors $m$, $T_0$, $k$ and $V_1$ in the equation (6) satisfy the following expression (7), $$m = \frac{k T_0}{V_1} \qquad (7)$$

the factor T is expressed by the following equation (8).

$$T = 2 T_0 \qquad (8)$$

Accordingly, it will be understood from the equation (8) that the factor or period T becomes constant.

In order to satisfy the equation (7) or select the factor $m$ to be equal to $(k T_0)/V_1$, it is sufficient to adjust or change the attenuation amount of the attenuator 17, for example. Further, in order to make the integrated value of the pulse signal or PWM signal $S_6$ within one period T equal to the integrated value of the input signal $S_1$ within the same period T, it is sufficient to select the value 1 for the constant $k$ in the embodiment shown in FIG. 3.

With the PWM signal amplifier to the invention described as above, a PWM signal is obtained having a constant frequency, and the integrated value of the PWM signal during one period is in proportion to the integrated value of the input signal during the same period, so that even if the PWM signal is detected or demodulated, the detected output signal is lower in distortion and is faithful to the original input signal.

The above description is given of only one preferred embodiment of the present invention, but it will be apparent that many modifications and variations could be effected by those skilled in the art without departing from the true scope of the invention as determined by the following claims.

What is claimed is:

1. A pulse width modulator, comprising:
   A. an input terminal supplied with an input modulating signal;
   B. a sawtooth wave signal generator;
   C. a first amplitude comparator connected to said input terminal to receive, as a first comparison signal, said input signal and connected to said sawtooth wave generator to receive, as a second comparison signal, the sawtooth signal therefrom to produce a train of first control signals when the amplitudes of said comparison signals become equal;
   D. bistable circuit means comprising first, second and third terminals, said first terminal being supplied with said first control signals;
   E. means to combine subtractively said input signal and an output signal from said second terminal of said bistable circuit means and to integrate the subtractively combined signals;
   F. a second amplitude comparator supplied with the output signal of said subtractive combining and integrating means and with a reference signal to produce a train of second control signals when the amplitudes of said signals supplied to said second comparator become equal; and
   G. means for supplying said second control signals to said third terminal of said bistable circuit means to produce a pulse width modulated signal at said second terminal of said bistable circuit means.

2. A pulse width modulator according to claim 1, in which said bistable circuit means is an R-S flip-flop circuit, the first terminal of which is a reset terminal, the third terminal of which is a set terminal, and the second terminal of which is a non-inverted output terminal.

3. A pulse width modulator according to claim 2 comprising a feedback circuit connected to said second terminal of said flip-flop circuit to receive said pulse width modulated signal therefrom, and in which said subtractive combining and integrating means comprises a subtracter circuit supplied with said input signal and with the output signal from said feedback circuit and further comprises an integrator circuit serially connected to the output terminal of said subtractor circuit, the output terminal of said integrator circuit being connected to one input terminal of said second amplitude comparator.

4. A pulse width modulator according to claim 3 in which the other input terminal of said second comparator circuit is connected to ground whereby said reference signal supplied to said amplitude comparator circuit is at ground potential.

5. A pulse width modulator according to claim 4 further comprising an attenuator connected between said input terminal and said first amplitude comparator.

6. A pulse width modulator according to claim 5, in which
A. said sawtooth wave generator comprises:
a. a first switching transistor having first, second and third electrodes,
b. a DC voltage source,
c. a resistor connecting said second electrode to one terminal of said DC voltage source, said first electrode being connected to the second terminal of said flip-flop circuit,
d. constant current means and a capacitor in series connected between said one terminal and a second terminal of said DC voltage source, and
e. a second switching transistor having first, second and third electrodes, the first electrode of said second transistor being connected to the third electrode of said first switching transistor, the second and third electrodes of said second transistor being connected across said capacitor; and B. said pulse width modulator further comprises circuit means connecting said capacitor to said first amplitude comparator to apply the voltage across said capacitor to said first comparator.

7. A pulse width modulator according to claim 6, in which said first switching transistor is of PNP type, said second switching transistor is of NPN type and said first, second and third electrodes of said first and second switching transistors are base, emitter and collector electrodes, respectively.

8. A pulse width modulator according to claim 1, further comprising:
A. an amplifier connected to the second terminal of said bistable circuit means to receive the pulse width modulated signal therefrom; and
B. a low pass filter connected at the output of said amplifier to produce a demodulated signal, the output of said amplifier being connected to the input of said subtractive combining and integrating means so as to apply an output pulse width modulated signal to said subtractive combining and integrating means.

9. A pulse width modulator comprising:
A. source means for supplying an input signal to be modulated;
B. means for generating a first reference signal;
C. a first comparator means for comparing said input signal and said first reference signal;
D. bistable circuit means for producing a pulse width modulated signal, the output of said first comparator being connected to said bistable circuit means to reset the same;
E. means for generating a second reference signal; and
F. a second comparator means for comparing said input signal and said second reference signal, the output of said second comparator being connected to said bistable circuit means to set the same.

10. A pulse width modulator according to claim 9, in which said second reference signal is derived from the output of said bistable circuit means.

11. A pulse width modulator according to claim 10, further comprising means for adding to the second comparator a third reference signal for controlling the timing for setting the bistable circuit means.

* * * * *